(12) United States Patent
Yen et al.

(10) Patent No.: US 6,535,432 B2
(45) Date of Patent: Mar. 18, 2003

(54) METHOD OF ERASING A NON-VOLATILE MEMORY

(75) Inventors: Ching-Fang Yen, Taipei Hsien (TW); Ful-Long Ni, Hsin-Chu City (TW)

(73) Assignee: Macronix International Co. Ltd., Hsin-Chu (TW)

( * ) Notice: Subject to any disclaimer, the term of this patent is extended or adjusted under 35 U.S.C. 154(b) by 5 days.

(21) Appl. No.: 09/871,662

(22) Filed: Jun. 4, 2001

(65) Prior Publication Data

US 2001/0050865 A1 Dec. 13, 2001

(30) Foreign Application Priority Data

Jun. 9, 2000 (TW) .................................. 089111238 A

(51) Int. Cl.[7] ................................................. G11C 7/00
(52) U.S. Cl. ............. 365/185.29; 365/218; 365/185.24; 365/185.25
(58) Field of Search ........................ 365/185.01, 185.24, 365/185.25, 185.29, 218

(56) References Cited

U.S. PATENT DOCUMENTS

| | | | | |
|---|---|---|---|---|
| 5,402,371 A | * | 3/1995 | Ono .............................. 365/218 |
| 5,402,373 A | * | 3/1995 | Aritome et al. .............. 365/218 |
| 5,457,652 A | * | 10/1995 | Brahmbhatt ............. 365/185.06 |
| 5,491,657 A | * | 2/1996 | Haddad et al. .......... 365/185.27 |
| 5,598,369 A | * | 1/1997 | Chen et al. .............. 365/185.27 |
| 5,600,592 A | * | 2/1997 | Atsumi et al. .......... 365/185.18 |
| 5,808,937 A | * | 9/1998 | Chi et al. ............... 365/185.33 |
| 6,055,655 A | * | 4/2000 | Momohara .................. 714/723 |
| 6,091,638 A | * | 7/2000 | Chang .................... 365/185.22 |
| 6,324,100 B1 | * | 11/2001 | Atsumi et al. ......... 365/185.27 |
| 6,370,064 B1 | * | 4/2002 | Kim ....................... 365/185.29 |

* cited by examiner

Primary Examiner—Viet Q. Nguyen
(74) Attorney, Agent, or Firm—Winston Hsu

(57) ABSTRACT

A method of erasing a non-volatile memory. The non-volatile memory is positioned on a substrate of a semiconductor wafer and has a memory array region. The memory array region has memory cells, word lines and a substrate line electrically connected to the substrate of each memory cell in the memory array region. The erasing method is to control a potential difference between a word line not to be erased and the substrate to within a specific range, then supply a predetermined first potential to a word line to be erased, thereafter float the word line not to be erased, and finally supply the substrate line with a predetermined second potential. The potential difference between the first and the second potential drive the charges stored in the floating gate of the memory cell electrically connected to the word line to be erased to move into the channel through the tunneling oxide layer to complete the erasing. The charges stored in the floating gate of the memory cell electrically connected to the word line not to be erased will be affected by factors such as an initial potential supplied to the word line not to be erased, the floated word line not to be erased, a change of the substrate potential, and a voltage coupling effect between the substrate and the word line not to be erased. So, the potential difference between the word line not to be erased and the substrate can be controlled to a specific range, and the memory cell not to be erased is not affected.

9 Claims, 5 Drawing Sheets

METHOD OF ERASING A NON-VOLATILE MEMORY

BACKGROUND OF THE INVENTION

1. Field of the Invention

The present invention provides a method of erasing a non-volatile memory, and more particularly, to a method of erasing an electrically erasable and programmable read-only memory (EEPROM).

2. Description of the Prior Art

A flash EEPROM device is composed of a large number of memory cells. Each memory cell comprises a floating gate for storing charges which represent data. After the floating gate of the memory cell is charged, the threshold voltage of the memory cell is lifted, so the charged memory cell will not be in a conductive state during addressing in reading. A state of not conducting is regarded as a "0" state by detecting circuits utilizing a binary system. Uncharged memory cells will be regarded as being in a "1" state. The floating gate is charged by utilizing the Fower-Nordheim tunneling mechanism. In this method, the floating gate is discharged, or erased, by forming a high potential between the control gate and the substrate, which transverse the tunneling oxide layer and produce a high electric field, so that negative charges trapped in the floating gate are sucked out and complete erasing.

Please refer to FIG. 1. FIG. 1 is a cross-sectional view of memory cells 137 and 138 in a non-volatile memory according to the prior art. The prior art non-volatile memory is positioned on a semiconductor wafer 110. The semiconductor wafer 110 comprises a semiconductor area 112. The two memory cells 137, 138 are positioned on the semiconductor area 112. A field oxide layer 120 is positioned on the semiconductor area 112 between the memory cells 137,138. The semiconductor area 112 can be a P-type substrate, or a P-type well positioned in the P-type substrate and isolated by an N-type well.

The memory cells 137, 138 comprise drains 113, 114 and sources 115, 116 positioned in the semiconductor area 112, respectively. Channels 117, 118 are positioned between the drains 113, 114 and the sources 115, 116, respectively. Tunneling oxide layers 121, 122 are positioned on the channels 117, 118, respectively. Floating gates 123, 124 are positioned on the tunneling oxide layers 121, 122, respectively. Isolating oxide layers 125, 126 are positioned on the floating gates 123, 124, and control gates 127, 128 are positioned on the isolating oxide layers 125, 126, respectively. Terminal 130 provides a substrate voltage Vsub to the semiconductor area 112. Terminals 131, 132 provide a gate voltage Vg to the control gates 127, 128, respectively.

While performing an optional erasing of the non-volatile memory, such as erasing charges stored in the floating gate 123 of the memory cell 137, but not erasing the memory cell 138, the prior art method floats the drains and sources of all of the memory cells. Then, a negative potential(such as −10 volts) is supplied from the terminal 131 to the control gate 127 of the memory cell 137 to be erased. The terminal 132 is grounded in order to supply a relative lower potential (0 V) to the control gate 128 of the memory cell 138 not to be erased. The terminal 130 supplies a positive potential(such as +10 V) to the semiconductor area 112. Therefore, a potential difference which transverses the tunneling oxide 121 is formed between the control gate 127 and the semiconductor area 112, and makes negative charges stored in the floating gate 123 accumulate toward the channel 117. Furthermore, the negative charges in the floating gate 123 are sucked to the channel 117, as a result of the Fowler-Nordheim tunneling mechanism, to complete the erasing.

When performing the optional erasing mentioned above, a substrate disturbance problem will occur. The memory cell 138 is not erased, so that the threshold voltage of the memory cell 138 does not change before and after the erasing of the memory cell 137. Detection circuits will regard the memory cell 138 as not in a conductive state when subsequently performing reading, that is, the detection circuits detect the "0" state, as described in the binary system. However, a high positive potential (such as 10 V) supplied to the semiconductor area 112 from the terminal 130 forms a potential difference between the control gate 128 of the memory cell 138 and the semiconductor area 112, which transverses the tunneling oxide layer 122, and causes some of the negative charges stored in the floating gate 124 to be sucked into the channel 118. Therefore the threshold voltage of the memory cell 138 is lowered, so that the memory cell 138 can be regarded as being in a conductive state by the detective circuits during the addressing in reading, and regarded as being in the "1" state described in the binary system.

Since the above-mentioned substrate disturbance problem occursing in the optional erasing mainly results from the memory cells being made in the same semiconductor area 112, today the memory cells are made in different semiconductor areas when manufacturing the non-volatile memory, in order to resolve the above problem. Please refer to FIG. 2. FIG. 2 is the cross-sectional view of memory cells 167, 168 of another non-volatile memory according to the prior art. The non-volatile memory is positioned on a semiconductor wafer 140. The semiconductor wafer 140 comprises a substrate 142, two P-type wells 163, 164 positioned in the substrate 142, and two memory cells 167, 168 positioned on the P-type wells 163, 164, respectively.

The memory cells 167, 168 comprise drains 143, 144 and sources 145, 146 positioned in the P-type wells 163, 164 in the substrate 142, respectively. Channels 147, 148 are positioned between the drains 143, 144 and the sources 145, 146, respectively. Tunneling oxide layers 151, 152 are positioned on the channels 147, 148. Floating gates 153, 154 are positioned on the tunneling oxide layers 151, 152. Isolating oxide layers 155, 156 are positioned on the floating gates 153, 154, and control gates 157, 158 are positioned on the isolating oxide layers 55, 156. Terminals 159, 160 supply a well potential Vw to the P-type wells 163, 164, respectively. Terminals 161, 162 supply a gate potential Vg to the control gates 157, 158, respectively.

While performing the optional erasing of the above-mentioned non-volatile memory, such as erasing the memory cell 167, but not erasing the memory cell 168, the prior art method floats the drains and the sources of all of the memory cells and grounds the terminals 160, 162, so that there will be no potential difference between the control gate 158 of the memory cell 168 and the P-type well 164. The terminal 159 supplies a high positive potential (such as +10 V) to the P-type well 163, and the terminal 161 provides a high negative potential (such as −10 V) to the control gate 157 of the memory cell 167 to be erased. Therefore, a high electric field which transverses the tunneling oxide 151 will be formed between the control gate 157 and the P-type well 163, making the negative charges stored in the floating gate 153 accumulate toward the channel 147. Furthermore, the negative charges in the floating gate 153 are sucked to the channel 147, as a result of the Fowler-Nordheim tunneling mechanism, to complete the erasing.

Since the memory cell 167, 168 is made on different P-type wells 163, 164 respectively, different potentials will be supplied to the memory cells 167, 168 and the P-type wells 163, 164, respectively, when performing the optional erasing, therefore the substrate disturbance problem is resolved. In the above-mentioned optional erasing, the control gate 158 of the memory cell 168 and the P-type well 164 are both grounded, therefore the negative charges stored in the floating gate 154 do not change before and after erasing. That is, the threshold voltage of the memory cell 168 does not change before and after erasing.

Although this method resolves the substrate disturbance problem and ensures the optional erasing quality of non-volatile memory, more layout area is required. Since the memory cells are formed on different semiconductor areas, and a distance required for isolating semiconductor areas will enlarge the layout area of the memory array, the layout area increases.

SUMMARY OF THE INVENTION

It is therefore a primary objective of the present invention to provide an erasing method of a non-volatile memory that requires a smaller layout area.

The present invention provides an erasing method of non-volatile memory. The non-volatile memory is positioned on a substrate of a semiconductor wafer, and the non-volatile memory comprises a memory array region. The memory array region comprises a plurality of memory cells, a plurality of word lines and a substrate line electrically connected to the substrate of each memory cell in the memory array region. Each memory cell comprises a source and a drain formed in the substrate of the semiconductor wafer, a channel positioned between the source and the drain, a tunneling oxide layer positioned on the channel, a floating gate positioned on the tunneling oxide layer for storing charges that represent data of the memory cell, an isolation oxide layer positioned on the floating gate, and a control gate positioned on the isolation oxide layer.

Each word line is electrically connected to the control gates of a predetermined number of memory cells in the memory array region. The erasing method according to the present invention is to control the potential difference between the word line not to be erased and the substrate to within a specific range, and supply a predetermined first potential to the word line to be erased, then float the word line not to be erased and, finally, supply a predetermined second potential to the substrate line. A potential difference between the first potential and the second potential drives the charges stored in the floating gate of the memory cell, wherein the memory cell is electrically connected to the word line to be erased, to move into the channel through the tunneling oxide layer to complete erasing. The charges stored in the floating gate of the memory cell that is electrically connected to the word line not to be erased are not affected because (a). the initial potential between the word line not to be erased and the substrate, (b). the word line not to be erased being floated, (c). the change of the substrate potential, and (d). a voltage coupling effect between the substrate and the floating word line, control a potential difference between the word line not to be erased and the substrate to within a specific range.

The present invention makes use of factors, such as a) the initial potential between the word line not to be erased and the substrate, b) the word line not to be erased being floated, c) the change of the substrate potential, and d) the voltage coupling effect between the substrate and the floating word line, to cause the charges stored in the floating gate of the memory cell that is electrically connected to the word line not to be erased not to be affected. Furthermore, the optional erasing method according to the present invention will not affect the memory cell not to be erased. Therefore, all of the memory cells can be fabricated on the same substrate, the layout area of the semiconductor wafer will not be wasted, and the reliability of the optional erasing of the non-volatile memory will be effectively improved.

It is an advantage of the present invention that it supplies the word line not to be erased with the initial potential, floats the word line not to be erased, and makes use of the voltage coupling effect between the word line not to be erased and the substrate to resolve the substrate disturbance problem completely. Therefore, the charges stored in the floating gate of the memory cell electrically connected to the word line not to be erased will not be affected. Furthermore, the optional erasing method according to the present invention will not affect the memory cell not to be erased, so that all of the memory cells can be fabricated on the same substrate, and the layout area of the semiconductor wafer is not wasted. The present invention also improves the reliability of the optional erasing of a non-volatile memory effectively.

These and other objectives of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
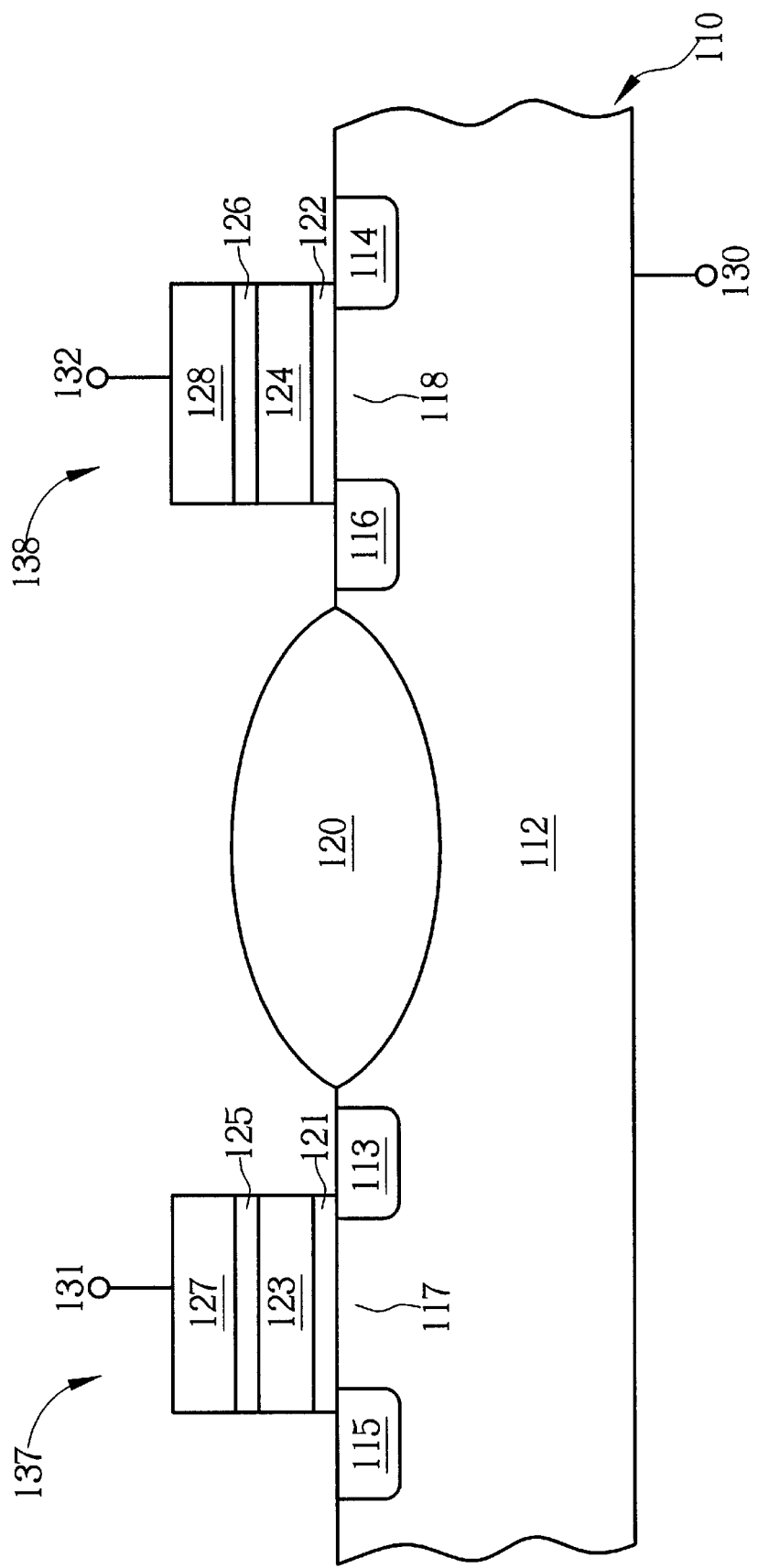
FIG. 1 is a cross-sectional view of a memory cell in a non-volatile memory according to the prior art.
Figure 2:
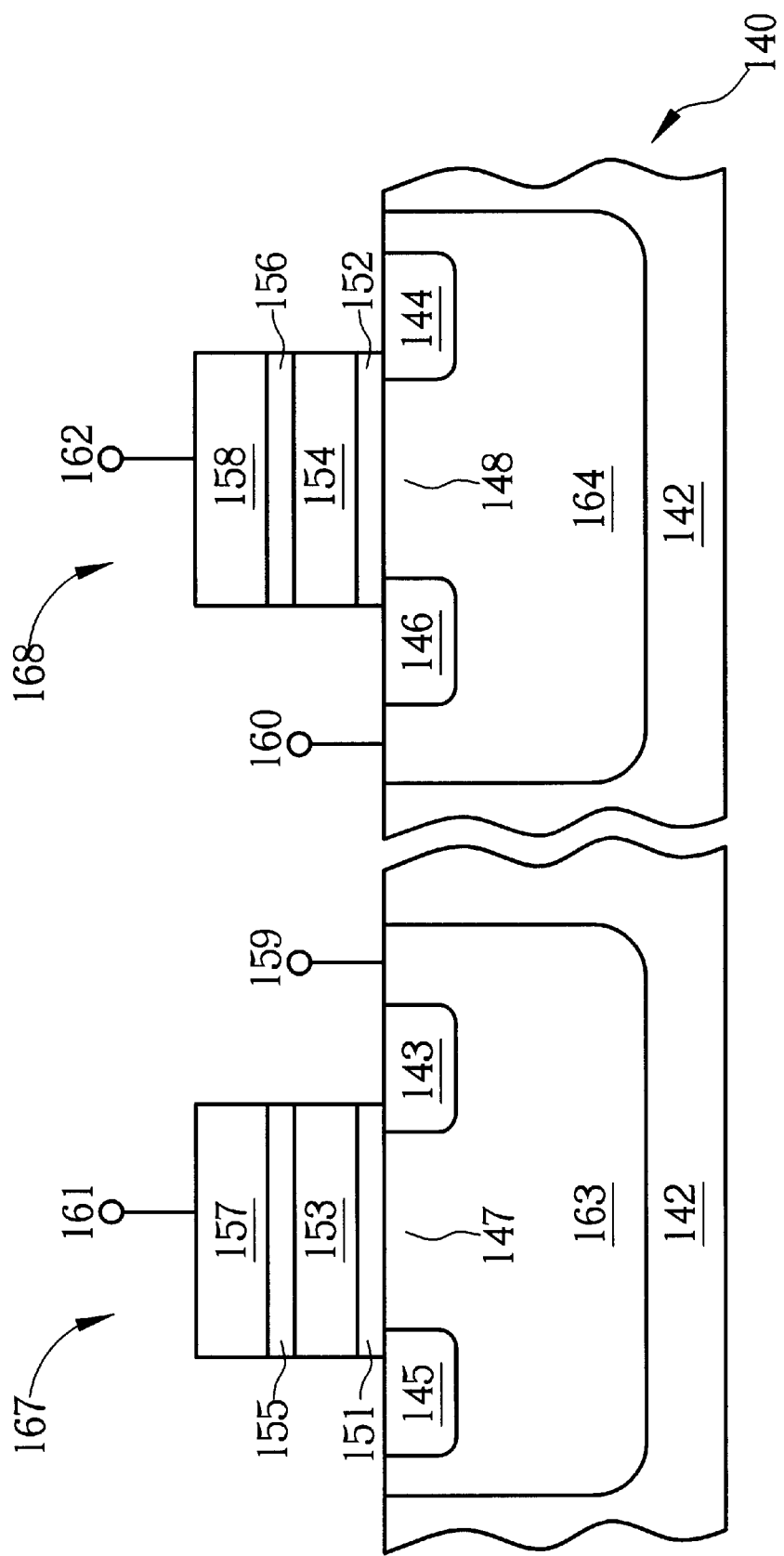
FIG. 2 is a cross-sectional view of a memory cell in another non-volatile memory according to the prior art.
Figure 3:
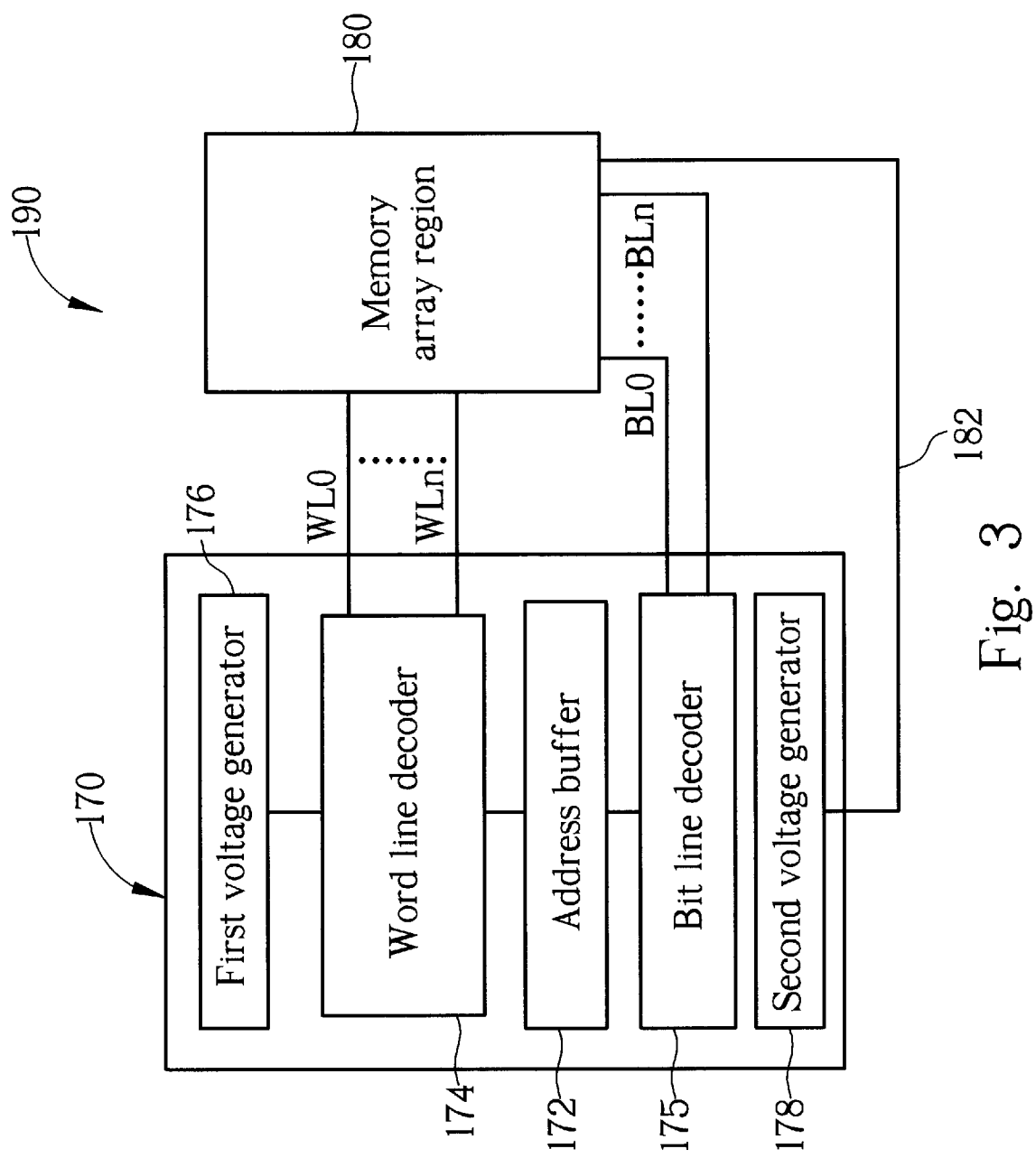
FIG. 3 is a block diagram of a non-volatile memory according to the present invention.

Please refer to FIG. 3. FIG. 3 is a block diagram of a non-volatile memory 190 utilizing an erasing method according to the present invention. The non-volatile memory 190 is positioned on a substrate(not shown) of a semiconductor wafer. The non-volatile memory 190 comprises a periphery area 170 and a memory array region 180. The periphery area 170 comprises an address buffer 172, a word line decoder 174 electrically connected to the word line WL in the memory array region 180, a bit line decoder 175 electrically connected to the bit line BL in the memory array region 180, a first voltage generator 176 electrically connected to the word line decoder 174 for supplying the word line decoder with a first initial potential and a first potential, a second voltage generator 178 electrically connected to a substrate line 182 in the memory array region 180 for supplying the substrate line 182 with a second initial potential and a second potential. The first potential supplied by the first voltage generator 176 is a high negative potential (such as −10 V), while the second potential supplied by the second voltage generator 178 is a high positive potential (such as +10 V).

Figure 4:
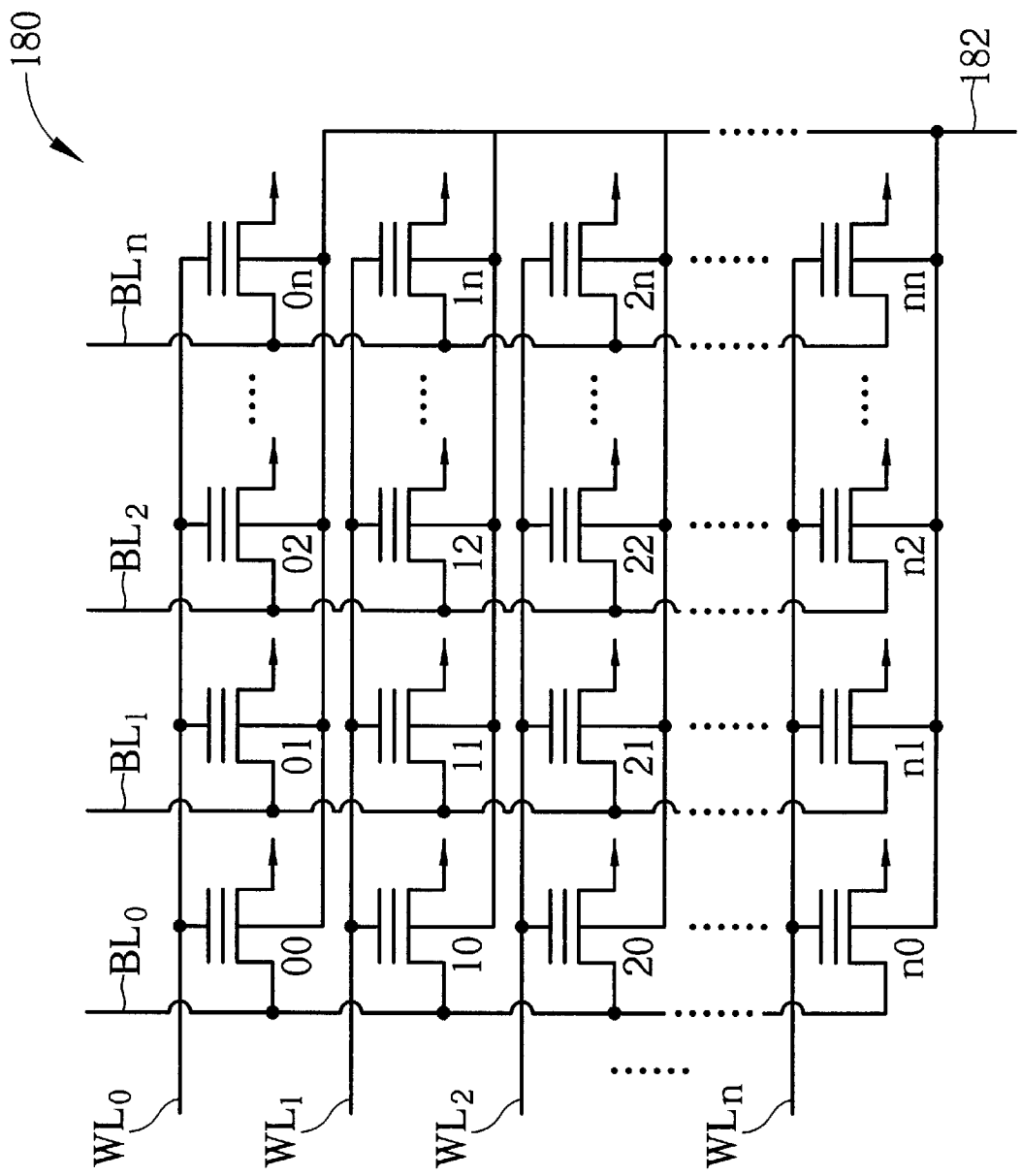
FIG. 4 is a structural diagram of a memory array in the non-volatile memory of FIG. 3.

Please refer to FIG. 4. FIG. 4 is a structural diagram of the memory array region 180 in the non-volatile memory 190 of FIG. 3. The memory array region 180 comprises n+1 word lines WL0 to WLn, n+1 bit lines BL0 to BLn, and (n+1)× (n+1) memory cells 00 to nn. The substrate line 182 electrically connects to the substrate 192 of each memory cell in the memory array region 180. Each word line WL is electrically connected to the control gates of a predetermined number of memory cells in the memory array region 180. For instance, word line WL0 is electrically connected to the control gates of the memory cells 00, 01 to 0n. Word line WLn is electrically connected to the control gates of the memory cells n0, n1 to nn.

Figure 5:
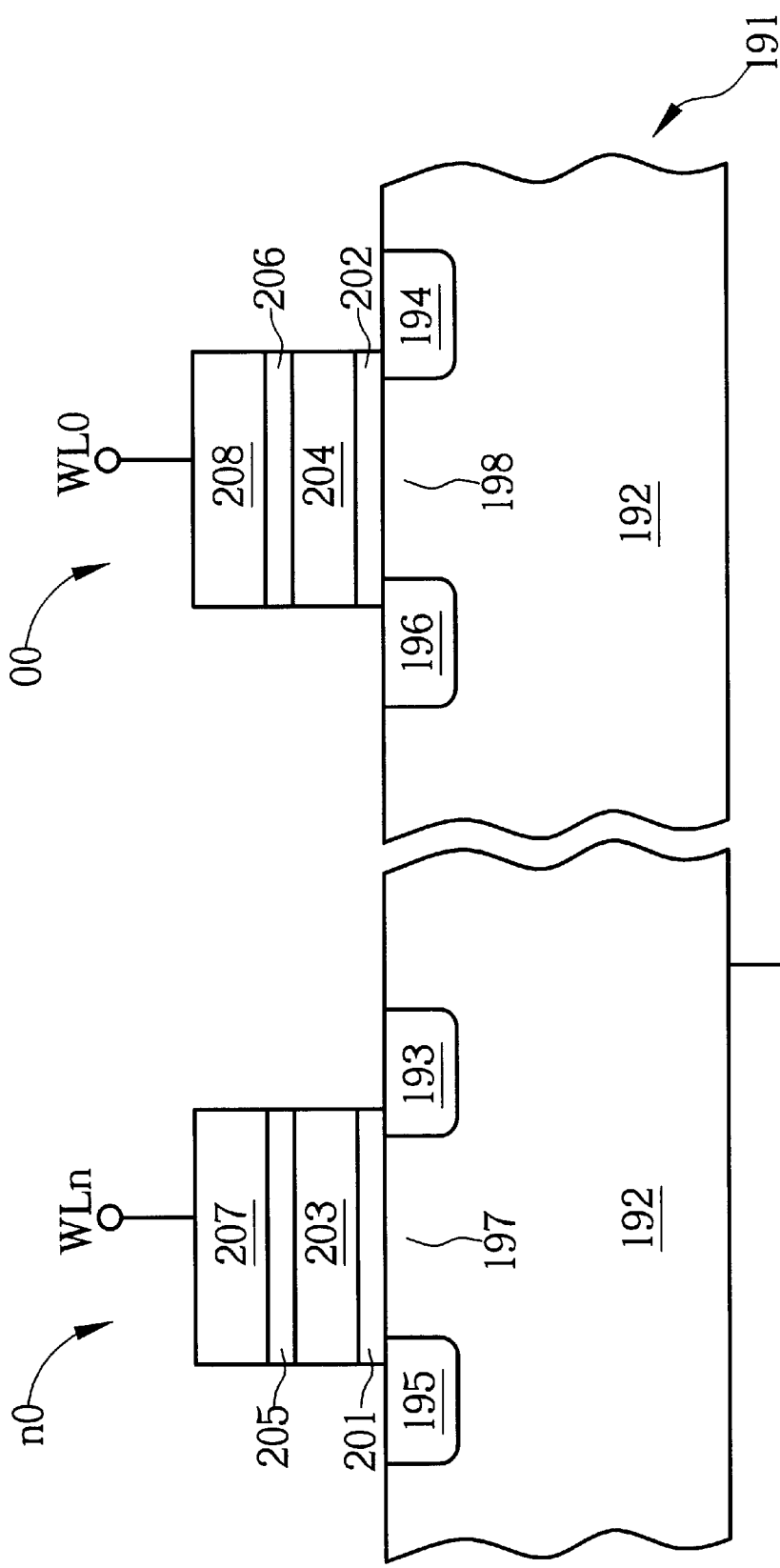
FIG. 5 is a cross-sectional view of a memory cell in the non-volatile memory according to the present invention.

Please refer to FIG. 5, FIG. 5 is a structural diagram of the memory cell in the non-volatile memory 190 according to the present invention. The non-volatile memory 190 is positioned on a substrate 192 of a semiconductor wafer 191. In the following description, memory cell 00 is used for illustrating the structure of the memory cell in the memory array region 180. The memory cell 00 comprises a source 194 and a drain 196 formed in the substrate 192 of the semiconductor wafer 190, a channel 198 positioned between the source 194 and the drain 196, a tunneling oxide layer 202 positioned on the channel 198, a floating gate 204 positioned on the tunneling oxide layer 202 for storing charges that represent data of the memory cell, an isolating oxide layer 206 positioned on the floating gate 204, and a control gate 208 positioned on the isolating oxide layer 206.

While performing the optional erasing of the non-volatile memory according to the present invention, the word line decoder 174 decodes an address signal from the address buffer 172. If the decoding result is to erase the memory cells 00~0n electrically connected to the word line WL0, and not to erase the memory cells 10~nn electrically connected to the word line WL1 to WLn, the first voltage generator 170 and the second voltage generator 178 will supply the word lines not to be erased (WL1 to WLn) and the substrate 182 with a predetermined potential, and the sources and the drains of all of the memory cells in the memory array region 180 are floated. Then, the first voltage generator 176 is utilized to supply the word line to be erased WL0 with a first potential. After that, the word line decoder 174 floats the word lines not to be erased (WL1 to WLn). Finally, the second voltage generator 178 is utilized to supply the substrate line 182 with a second potential. In another preferred embodiment of the present invention, while performing the optional erasing of the non-volatile memory according to the present invention, the word line decoder 174 decodes an address signal from the address buffer 172. If the decoding result is to erase the memory cells 00~0n electrically connected to the word line WL0, and not to erase the memory cells 10~nn electrically connected to the word line WL1 to WLn, the first voltage generator 170 and the second voltage generator 178 will supply the word lines not to be erased (WL1 to WLn) and the substrate 182 with a predetermined potential. Then the word line decoder 174 floats the word lines not to be erased (WL1 to WLn) after floating the source and the drain of all of the memory cells in the memory array region 180. After that, the first voltage generator 176 supplies the word line to be erased (WL0) with a first potential. Finally the second voltage generator 178 supplies the substrate line 182 with a second potential.

Since a potential difference which transverses the tunneling oxide layer 202 is produced in the memory cell 00 by the first potential supplied to the word line to be erased (WL0) and the second potential supplied to the substrate line 182, the charges stored in the floating gate 204 will be driven to move into the channel 198 through the tunneling oxide layer 202 to complete erasing. With the same principle, the charges stored in the floating gate of the memory cells 01 to 0n are erased at the same time, therefore the charges stored in the floating gates of the memory cells 00 to 0n electrically connected to the word line to be erased (WL0) are erased. While performing optional erasing, the potential supplied to the word line to be erased WL0 in the memory cell is a negative voltage, the potential supplied to the substrate line 182 is a positive voltage, and the magnitude of the positive voltage and the negative voltage are determined by the physical characteristics of the memory cell. This potential creates an electric field across the tunnel oxide between the floating gate and the channel in substrate which pull electrons off the floating gate. It is preferred that the potential difference between the word lines not to be erased (WL1 to WLn) and the substrate line 182 is as close to zero as possible. Before performing the erasing, a first initial potential is supplied to the word lines not to be erased (WL1 to WLn) and a second initial potential is supplied to the substrate line 182 in the present invention. Then the word lines not to be erased (WL1 to WLn) are floated and the substrate line 182 is supplied with the second potential.

According to the voltage coupling effect between the substrate 192 and the floating word lines not to be erased (WL1 to WLn), the potential of the floating word lines not to be erased (WL1 to WLn) increases with an increasing of the potential of the substrate 192. The increasing voltage value relates to the manufacturing method of the memory cell, since the manufacturing method decides a coupling ratio between the substrate 192 and the floating word lines not to be erased (WL1 to WLn). The objective of supplying the first initial potential and the second initial potential is to make the potential difference between WL1 to WLn and the substrate 192 approximately zero after supplying the substrate 192 with the second potential, making the magnitude of the first initial potential and the second initial potential depend on the coupling ratio. For instance, when a voltage of 10 V is supplied to the substrate 192, the word lines not to be erased (WL1 to WLn) acquire 8 V coupling if the coupling ratio is 80%. Therefore, the first initial potential is set at 2 V and the second initial potential is set at 0 V, which makes the potential difference between the word lines WL1 to WLn of the memory cells not to be erased and the substrate 192 become zero while performing erasing. When a voltage of 10 V is supplied to the substrate 192, the word line WL1 to WLn of the memory cells not to be erased will acquire 10 V coupling if the coupling ratio is 100%. Therefore the first initial potential is set at 0 V and the second initial potential is set at 0 V, which makes the potential difference between the word lines WL1 to WLn of the memory cells not to be erased and the substrate 192 become zero while performing erasing, and the charges stored in the floating gate of the memory cells not to be erased are not affected and erased.

The erasing method according to the present invention utilizes the word line decoder in conjunction with the voltage generator. Firstly, the potential supplied to the word line not to be erased and the potential supplied to the substrate are controlled to within a specific range. Then, the word line to be erased is supplied with a predetermined potential. Thereafter, the word line not to be erased is floated. Finally, the substrate is supplied with a predetermined potential. Therefore, the charges stored in the floating gate of the memory cell electrically connected to the word line to be erased can be erased, the charges stored in the memory cell electrically connected to the word line not to be erased will not be affected. The present invention can effectively improve the reliability of the optional erasing of a non-volatile memory.

Compared to the prior art optional erasing method, which exhibits the substrate disturbance problem and the waste of the layout area of the memory array region, the present invention supplies the word line not to be erased with the initial potential, floats the word line not to be erased, and utilizes the voltage coupling effect between the word line not to be erased and the substrate to resolve the substrate disturbance problem completely. Therefore, the charges stored in the floating gate of the memory cell electrically connected to the word line not to be erased will not be affected. Furthermore, the optional erasing method according to the present invention does not affect the memory cell not to be erased, therefore all of the memory cells can be fabricated on the same substrate, and the layout area of the semiconductor wafer will not be wasted. The present invention can not only make use of the layout area of the semiconductor substrate more effectively, but also effectively improves the reliability of the optional erasing of a non-volatile memory.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An erasing method of a non-volatile memory, the non-volatile memory being positioned on a substrate of a semiconductor wafer, the non-volatile memory comprising a memory array region, the memory array region comprising:

a plurality of memory cells, all of the memory cells of an array fabricated on the same substrate, each memory cell comprising:

a source and a drain positioned in the substrate of the semiconductor wafer;

a channel positioned between the source and the drain;

a tunneling oxide layer positioned on the channel;

a floating gate positioned on the tunneling oxide layer to store charges, the charges representing data of the memory cell;

an isolating oxide layer positioned on the floating gate; and a control gate positioned on the isolating oxide layer;

a plurality of word lines, each word line being electrically connected to the control gates off a predetermined number of memory cells in the memory array region; and a substrate line, the substrate line being electrically connected to the substrate of each memory cell in the memory array region;

the method comprising:

applying an first initial potential to the word line not to be erased and a first potential to the word line to be erased; and applying a second potential to the substrate line;

wherein the first initial potential and the second potential together cause the word line not to be erased to be substantially floating, and a potential difference between the first potential and the second potential effectively neutralizes the charges stored in the memory cell that is electrically connected to the word line to be erased, while the charges stored in the memory cell that is electrically connected to the word line not to be erased are not affected.

2. The erasing method of claim 1 wherein the non-volatile memory further comprises a peripheral circuit region, the peripheral circuit region comprising:

a word line decoder electrically connecting to the word lines in the memory array region;

a first voltage generator electrically connecting to the word line decoder, the first voltage generator supplying the word line decoder with the first initial potential and the first potential; and a second voltage generator electrically connecting to the substrate line in the memory array region, the second voltage generator supplying the substrate line with a second initial potential and the second potential;

wherein while performing the erasing method, the word line decoder supplies the first potential from the first voltage generator to the word line to be erased and floats the word line not to be erased, and the second voltage generator supplies the second potential to the substrate line, erasing the charges stored in the floating gate of the memory cell that is electrically connected to the word line to be erased.

3. The erasing method of claim 2 wherein while performing the erasing method, the word line not to be erased is floated, and the second potential is supplied to the substrate line, the potential of the floating word line not to be erased increases with an increasing of the potential of the substrate, according to a voltage coupling effect between the substrate and the floating word line not to be erased, the value of the increasing potential depends on a coupling ratio between the substrate and the floating word line not to be erased.

4. The erasing method of claim 3 wherein before performing the erasing method, the first initial potential is supplied to the word line not to be erased, and the second initial potential is supplied to the substrate line, the values of both the first initial potential and the second initial potential depends on the coupling ratio between the substrate and the floating word line not to be erased, and the potential difference between the substrate and the floating word line not to be erased approaching zero as the potential of the substrate is increased.

5. The erasing method of claim 1 wherein the non-volatile memory further comprises a peripheral circuit region, the peripheral circuit region comprising:

a word line decoder electrically connecting to the word lines in the memory array region;

a first voltage generator electrically connecting to the word line decoder, the first voltage generator supplying the word line decoder with the first initial potential and the first potential; and a second voltage generator electrically connecting to the substrate line in the memory array region, the second voltage generator supplying the substrate line with a second initial potential and the second potential;

wherein while performing the erasing method, the word line decoder puts the word line not to be erased in a floating state, and supplies the first potential from the first voltage generator to the word line to be erased, and the second voltage generator supplies the second potential to the substrate line, erasing the charges stored in the floating gate of the memory cell that is electrically connected to the word line to be erased.

6. The erasing method of claim 5 wherein while performing the erasing method, the word line not to be erased is floated, and the second potential is supplied to the substrate line, the potential of the floating word line not to be erased increases with an increasing of the potential of the substrate, according to a voltage coupling effect between the substrate and the floating word line not to be erased, the value of the increasing potential depends on a coupling ratio between the substrate and the floating word line not to be erased.

7. The erasing method of claim 6 wherein before performing the erasing method, the first initial potential is supplied to the word line not to be erased and the second initial potential is supplied to the substrate line, the values of both the first initial potential and the second initial potential depends on the coupling ratio between the substrate and the floating word line not to be erased, and the potential difference between the substrate and the floating word line not to be erased approaching zero as the potential of the substrate in increased.

8. The erasing method of claim 1 wherein the first potential is negative, the second potential is positive, and the values of both the first potential and the second potential depend on physical characteristics of the memory cells.

9. The erasing method of claim 1 wherein while performing the erasing method, the source and the drain of each memory cell in the memory array region are floated.

* * * * *